(12) United States Patent
Vincent et al.

(10) Patent No.: US 6,961,248 B2
(45) Date of Patent: Nov. 1, 2005

(54) ELECTRONICS ASSEMBLY

(75) Inventors: William Hunt Vincent, Yateley (GB); Jay Kevin Osborn, Crowthorne (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/166,508

(22) Filed: Jun. 10, 2002

(65) Prior Publication Data
US 2003/0227757 A1 Dec. 11, 2003

(51) Int. Cl.$^7$ ............................................. H05K 7/14
(52) U.S. Cl. ..................... 361/796; 361/697; 361/775; 361/687; 415/213.1
(58) Field of Search ................. 361/796, 797, 361/801, 672, 694, 695, 693, 715, 724, 740, 361/687, 692, 717, 697, 690, 775, 718, 752; 164/185, 121; 415/213.1

(56) References Cited

U.S. PATENT DOCUMENTS

| | | |
|---|---|---|
| 2,957,668 A | 10/1960 | Norquist et al. |
| 4,083,616 A | 4/1978 | McNiece et al. |
| 4,751,872 A | 6/1988 | Lawson, Jr. |
| 4,914,552 A | 4/1990 | Keemer |
| 4,974,377 A | 12/1990 | Dominitz et al. |
| 5,100,096 A | 3/1992 | Mizuno et al. |
| 5,124,886 A | 6/1992 | Golobay |
| 5,145,243 A | 9/1992 | Liu |
| 5,189,277 A | 2/1993 | Boisvert et al. |
| 5,214,572 A | 5/1993 | Cosimano et al. |
| 5,216,578 A | 6/1993 | Zenitani et al. |
| 5,264,986 A | 11/1993 | Ohgami et al. |
| 5,333,830 A | 8/1994 | Millen |
| 5,373,133 A | 12/1994 | Brockway et al. |
| 5,394,305 A | 2/1995 | Moral et al. |
| 5,460,441 A | 10/1995 | Hastings et al. |
| 5,562,410 A | 10/1996 | Sachs et al. |
| 5,593,219 A | 1/1997 | Ho |
| 5,644,991 A | 7/1997 | Prevot et al. |
| 5,663,868 A | 9/1997 | Stalley |
| 5,734,558 A | 3/1998 | Poplawski et al. |
| 5,734,561 A | 3/1998 | Wolf et al. |
| 5,741,985 A | 4/1998 | Gaete |
| 5,751,549 A * | 5/1998 | Eberhardt et al. .......... 361/687 |
| 5,758,855 A | 6/1998 | Jordan et al. |

(Continued)

FOREIGN PATENT DOCUMENTS

EP 1198867 3/2004

(Continued)

OTHER PUBLICATIONS

"Pluggable Fan Assembly", IBM Corp., IBM Technical Disclosure Bulletin, vol. 32, No. 3A, Aug., 1989.

(Continued)

Primary Examiner—Randy Gibson
Assistant Examiner—Hung S. Bui
(74) Attorney, Agent, or Firm—Meyertons Hood Kivlin Kowert & Goetzel, P.C.; B. Noël Kivlin

(57) ABSTRACT

A chassis for an electronics assembly comprises:
(i) a frame (1); and
(ii) a panel (31) located on a face of the frame, the panel comprising a plurality of cooling fans (22) and a holder (30) for the fans.

The panel allows removal of individual fans from the panel and replacement of any fans while the panel is located on the frame, and the frame allows removal of the panel therefrom and replacement of the panel. The chassis thus allows replacement of any fans without the assembly being shut down, and also reduces downtime of the assembly if all the fans need replacing, for example for maintenance.

14 Claims, 4 Drawing Sheets

U.S. PATENT DOCUMENTS

| | | | |
|---|---|---|---|
| 5,777,845 A | 7/1998 | Krum et al. | |
| 5,788,467 A | 8/1998 | Zenitani et al. | |
| 5,808,876 A | 9/1998 | Mullenbach et al. | |
| 5,838,551 A | 11/1998 | Chan | |
| 5,864,088 A | 1/1999 | Sato et al. | |
| 5,877,938 A * | 3/1999 | Hobbs et al. | 361/724 |
| 5,884,988 A | 3/1999 | Foo et al. | |
| 5,886,639 A | 3/1999 | Behl et al. | |
| 5,914,864 A | 6/1999 | MacDonald et al. | |
| 5,944,199 A | 8/1999 | Corisis et al. | |
| 5,973,926 A | 10/1999 | Sacherman et al. | |
| 5,975,659 A | 11/1999 | Yang et al. | |
| 5,980,295 A | 11/1999 | Lai et al. | |
| 5,996,960 A | 12/1999 | Krajec | |
| 6,031,719 A | 2/2000 | Schmitt et al. | |
| 6,031,733 A | 2/2000 | Corisis et al. | |
| 6,040,981 A * | 3/2000 | Schmitt et al. | 361/695 |
| 6,061,237 A * | 5/2000 | Sands et al. | 361/695 |
| 6,075,694 A | 6/2000 | Mills et al. | |
| 6,075,698 A | 6/2000 | Hogan et al. | |
| 6,088,222 A | 7/2000 | Schmitt et al. | |
| 6,115,237 A * | 9/2000 | Zahorsky et al. | 361/679 |
| 6,115,250 A | 9/2000 | Schmitt | |
| 6,129,327 A | 10/2000 | Dubois | |
| 6,138,347 A | 10/2000 | Persson et al. | |
| 6,141,211 A | 10/2000 | Strickler et al. | |
| 6,147,862 A | 11/2000 | Ho | |
| 6,147,873 A | 11/2000 | Huang | |
| 6,166,900 A | 12/2000 | Flynn et al. | |
| 6,185,097 B1 | 2/2001 | Behl | |
| 6,191,928 B1 | 2/2001 | Rector et al. | |
| 6,213,819 B1 | 4/2001 | Fan | 439/894 |
| 6,215,659 B1 | 4/2001 | Chen | |
| 6,219,229 B1 | 4/2001 | Lee | |
| 6,227,515 B1 | 5/2001 | Broyles | |
| 6,236,564 B1 * | 5/2001 | Fan | 361/695 |
| 6,244,953 B1 | 6/2001 | Dugan et al. | |
| 6,247,898 B1 * | 6/2001 | Henderson et al. | 417/3 |
| 6,252,770 B1 | 6/2001 | Yu et al. | |
| 6,256,205 B1 | 7/2001 | Perry et al. | |
| 6,267,606 B1 | 7/2001 | Poplawski et al. | |
| 6,285,547 B1 | 9/2001 | Vigeant et al. | |
| 6,297,950 B1 | 10/2001 | Erwin | |
| 6,322,042 B1 * | 11/2001 | Nemec | 248/694 |
| 6,324,075 B1 | 11/2001 | Unrein et al. | |
| 6,325,636 B1 | 12/2001 | Hipp et al. | |
| 6,330,156 B1 | 12/2001 | Cresse | |
| 6,351,308 B1 * | 2/2002 | Mestha | 356/402 |
| 6,373,695 B1 | 4/2002 | Cheng | |
| 6,373,698 B1 | 4/2002 | Christensen | |
| 6,388,875 B1 | 5/2002 | Chen | |
| 6,395,976 B1 | 5/2002 | Koradia et al. | |
| 6,406,257 B1 * | 6/2002 | Houdek | 415/213.1 |
| 6,411,506 B1 * | 6/2002 | Hipp et al. | 361/686 |
| 6,411,526 B1 | 6/2002 | Nguyen et al. | |
| 6,414,845 B2 | 7/2002 | Bonet | |
| 6,442,020 B1 | 8/2002 | Liu et al. | |
| 6,473,297 B1 | 10/2002 | Behl et al. | |
| 6,480,391 B1 | 11/2002 | Monson et al. | |
| 6,510,055 B1 | 1/2003 | Liu et al. | |
| 6,515,854 B1 | 2/2003 | Claprood | |
| 6,522,539 B2 | 2/2003 | Ota et al. | |
| 6,526,333 B1 | 2/2003 | Henderson et al. | 700/300 |
| 6,549,406 B1 | 4/2003 | Olesiewicz et al. | |
| 6,556,437 B1 | 4/2003 | Hardin | |
| 6,563,706 B1 | 5/2003 | Strickler | |
| 6,590,768 B1 | 7/2003 | Wiley | |
| 6,594,148 B1 | 7/2003 | Nguyen et al. | |
| 6,603,661 B2 * | 8/2003 | Smith et al. | 361/695 |
| 6,621,708 B1 | 9/2003 | Sparkes et al. | |
| 6,621,709 B1 | 9/2003 | Schnabel et al. | |
| 6,621,711 B1 | 9/2003 | Haworth et al. | |
| 6,678,157 B1 | 1/2004 | Bestwick | |
| 6,680,850 B2 | 1/2004 | Osborn et al. | |
| 6,683,794 B2 | 1/2004 | Schnabel et al. | |
| 6,700,351 B2 | 3/2004 | Blair et al. | |
| 2002/0044421 A1 | 4/2002 | Cheng | |
| 2002/0048520 A1 | 4/2002 | Lu et al. | |
| 2002/0060900 A1 | 5/2002 | Qiu | |
| 2002/0112653 A1 | 8/2002 | Moore, Jr., et al. | |
| 2002/0126461 A1 | 9/2002 | Yazaki | |
| 2002/0167797 A1 | 11/2002 | Willers et al. | |
| 2002/0173265 A1 | 11/2002 | Kipka et al. | |
| 2003/0063454 A1 | 4/2003 | Wilson et al. | |
| 2003/0226675 A1 | 12/2003 | Osborn et al. | |
| 2003/0226949 A1 | 12/2003 | Cain et al. | |
| 2003/0227752 A1 | 12/2003 | Yair et al. | |
| 2003/0227755 A1 | 12/2003 | Haworth | |
| 2004/0032722 A1 | 2/2004 | Wrycraft et al. | |

FOREIGN PATENT DOCUMENTS

| | | |
|---|---|---|
| GB | 2211360 | 6/1989 |
| JP | 05-021973 | 1/1993 |
| JP | 2000-151137 | 5/2000 |
| JP | 2002-145267 | 5/2002 |
| JP | 2002-145269 | 5/2002 |
| WO | 99/60834 | 11/1999 |

OTHER PUBLICATIONS

"Fan/Board Mounting Bracket", IBM Corp., IBM Technical Disclosure Bulletin, vol. 38, No. 06A, Jun. 1993.

International search report application No. GB0313231.3 mailed Aug. 15, 2003.

* cited by examiner

ELECTRONICS ASSEMBLY

BACKGROUND OF THE INVENTION

The present invention relates to electronics assemblies, and is primarily concerned with thermal management therein. Many such assemblies will be located in racks for housing in for example nineteen inch cabinets, or other size cabinets, in cabinets such as twenty three inch or metric cabinets. The assemblies may for instance be employed as servers for a number of systems, for example in local area networks (LANs), wide area networks (WANs), telecommunications systems or other operations such as database management or as internet servers.

Such an assembly will typically comprise a supporting chassis that houses a motherboard or backplane and a number of daughterboards or module cards that extend in planes generally perpendicular to the plane of the motherboard. Because of the amount of heat that is generated during operation of the equipment and the thermal sensitivity of the equipment, it is necessary to provide cooling fans in order to direct a current of air through the assembly or otherwise permanent damage would occur. In the case of large computer systems, this may be accomplished by arranging the fans in an array that extends over the cross-sectional area of the system. In order to simplify the assembly of the system the fans may be arranged in a tray which can be installed or replaced as a unit when one or more components of the tray fails.

Increasing package density in large computer systems brings additional challenges. Compactness is desirable in order to permit installation of more systems in limited space that is available in data centres where the equipment will be housed. However, increased component count in large systems, can cause an increase in downtime of the system where one of the components has failed. It is therefore desirable for such failure not to require shutdown of the system where possible, and if shutdown is necessary, to minimise the time taken.

SUMMARY OF THE INVENTION

According to one aspect, the present invention, there is provided a chassis for an electronics assembly, the chassis comprising:
(i) a frame; and
(ii) a panel located on a face of the frame, the panel comprising a plurality of cooling fans and a holder for the fans, wherein the panel allows removal of individual fans from the panel and replacement of any fans while the panel is located on the frame, and the frame allowing removal of the panel therefrom and replacement of the panel.

According to another aspect, there is provided a panel for attachment to the chassis of an electronics assembly, which comprises a plurality of cooling fans and a holder for the fans, wherein the panel is attachable to, and removable from, the chassis as a single item, and the panel allows removal of individual fans therefrom and replacement of any fans while attached to the chassis.

Thus, the chassis and panel according to the invention have the advantage that, if any fans of the system fail, the entire array of fans can be removed and replaced relatively quickly by removing the panel from the chassis as a single item, thereby reducing the downtime of the system. Alternatively, if only a single fan has failed or a small number thereof have failed, fans may be removed from the panel individually and replaced, without removing the panel from the chassis. Each fan of the array may, for example, have its own connection to a source of power, and thus enable individual fans to be removed from the panel and replaced while the remaining fans remain in operation, thereby enabling individual fans to be replaced without incurring any downtime.

The number of fans that are arranged in the panel will depend on the nature and size of the electronics assembly and of the fans, but the number will may be such that will enable a rectangular array to be formed in the panel having dimensions that correspond to the internal volumes of the assembly. Thus, the panel may, for example, house two, four, six, eight, nine or twelve fans to provide an appropriate rectangular array. The fans may, at least in the broadest aspect of the invention, differ from one another, but in many cases the fans and the recesses in the panel will be identical, so that the inventory required to service the system will be reduced. Furthermore, it is not necessary for all the fans to be arranged in a single panel. It may, in some designs of equipment be desirable for more than one panel to be present, each panel containing a fraction of the total number of fans.

The holder for the fans may be generally flat, for example in cases where the fans are arranged on one surface of the chassis. However, this is not always the case and non-flat holders may be employed for example where the panel is intended to extend over more than one surface of the chassis.

The fans will normally be present in the form of a module in which a fan is housed in a generally rectangular body or housing having a central aperture in which the fan motor and blades are located and which allows passage of air therethrough. When employed in such a form, it can usually be a relatively easy and quick operation to change any of the fans in the panel. However, it may be appropriate for the fans to be secured to the holder by an arrangement that requires a tool, e.g. a key or screwdriver, to release it from the holder in order to prevent inadvertent removal. In order to facilitate quick removal and replacement of the fans, the fans may be accommodated in the holder in such a way that they are secured therein by means of a single element, e.g. a threaded element that requires use of the tool to release. Typically, the fan is attached to the holder by means of at least one cooperating tab and recess or other feature for the same purpose, so that the tab and recess may simply be engaged and the threaded element tightened in order to secure the fan in the panel. This may conveniently be achieved by including a sheet member on the fan module (the sheet member having an aperture corresponding to the aperture in the fan module body) which provides the tab and also, on the other side of the fan, a support for a captive threaded element. The provision of a sheet member. e.g. formed from aluminium zinc plated steel that is employed for the chassis, to provide the tabs and the support for the threaded element has the advantage that any increase in thickness of the panel is minimised. Alternatively it is possible to provide the holder in the form of a frame that extends around the fan but does not extend over any part of the face thereof and so does not add to its thickness.

The panel may be attached to the chassis in any of a number of ways, although it is disadvantageous simply to screw the panel or the housing to the chassis in view of the length of time needed for removal and replacement. The panel may therefore be attached to the chassis by a quick-release mechanism, that is to say, a mechanism that requires no screws to support the panel on the chassis but simply one or more cooperating elements such as tabs, pins, recesses etc that are fixed on the panel and the chassis in order to hold the panel on the chassis and allow it to be lifted off. It may be necessary to include one or more elements that secure the panel to the chassis against accidental or malicious removal of the panel (as opposed to supporting the panel on the chassis), for example elements that require a tool for removal, and especially the same tool as is required for removal of the individual fans. Thus, the holder may have one or two captive threaded elements such as screws that must be unscrewed before the panel can be lifted off the chassis. The mechanism for attaching the panel to the chassis may include a keyhole plate on one of the holder and chassis, and corresponding engaging elements such as tabs or pins on the other, but this may require a degree of depth in the holder or the front plate of the chassis in order to accommodate the relevant attachment elements. The panel may be arranged so that the arrangement for attaching it to the chassis does not cause its thickness to be increased, for example by locating any such elements on the edges thereof to the side of the fans. For example, the panel may be attached to the chassis by means of one or more pins or other protuberances either on the panel or on the chassis that engage corresponding recesses in the chassis or panel. The pins may be arranged on the panel, extending to the side thereof so that the panel may be opened in the manner of a door that is supported by hinges. The panel may, in this embodiment, be retained against the chassis by means of the tool operated element or elements for preventing removal of the panel, located in the region of the opposite edge of the panel to the pins. Where the panel is supported on the chassis by means of pins that engage recesses, a grommet, for example formed from rubber, or other material, may be inserted into the recess in order to allow relative movement between the panel and the chassis, for example to allow the panel to be swung out from the chassis, and also to accommodate any tolerances in the manufacture of the holder and the chassis.

The panel may include a gasket that extends around the periphery of the panel between the panel and the chassis in order to prevent or reduce bypass leakage of air around the fans. The gasket may be attached to the holder of the panel or to the chassis as desired. In addition or alternatively, the panel may include a gasket that extends around the periphery of each fan between the fan and the holder in order to prevent or reduce bypass leakage of air around that fan. The gaskets, whether extending around the panel or the individual fans, may be formed from any appropriate material, for example a textile felt, from plastics or rubber, or from metal.

The chassis may contain a monitoring arrangement for monitoring each fan. The monitoring arrangement may, for example, send a message to a central location in order to inform the location of the status of the fans, and in particular, whether or not any fan has developed a fault and needs to be replaced. The monitoring arrangement may be located in the body of the chassis, but it is convenient for it to be located on the panel itself. Such a monitoring arrangement may take the form of a pcb having an LED or other device to inform the service engineer which fan has developed a fault in addition to sending a message to the central location. Typically, the pcb will be elongated and will extend along the centre of the panel so that a part of the pcb will be adjacent to each of the fans. The arrangement may be located on either side of the panel, but if it is located on the inner side of the panel, i.e. the side of the panel that faces the interior of the chassis when it is attached to the chassis, the arrangement will be protected from accidental damage, for example caused physically or due to electrostatic discharge.

The holder for the fans may be formed from any of a number of materials, but normally part of the holder will be required to seat each fan, and so will be positioned over a major surface of the fan and will therefore add to the thickness of the panel. If the holder is formed from sheet metal, for example aluminium zinc plated steel from which the chassis is formed, the increase in thickness will be minimised. Where the fans are held in position by means of a sheet member, the total thickness of the panel may simply be the sum of the thickness of the fan, the thickness of the sheet metal forming the at holder and the thickness of the sheet member that holds the fan in position in the holder.

BRIEF DESCRIPTION OF THE DRAWINGS

Embodiments of the present invention will now be described in detail by way of example with reference to the accompanying drawings, in which corresponding parts are given like reference numbers. In the drawings.

DESCRIPTION OF PARTICULAR EMBODIMENTS

Figure 1:
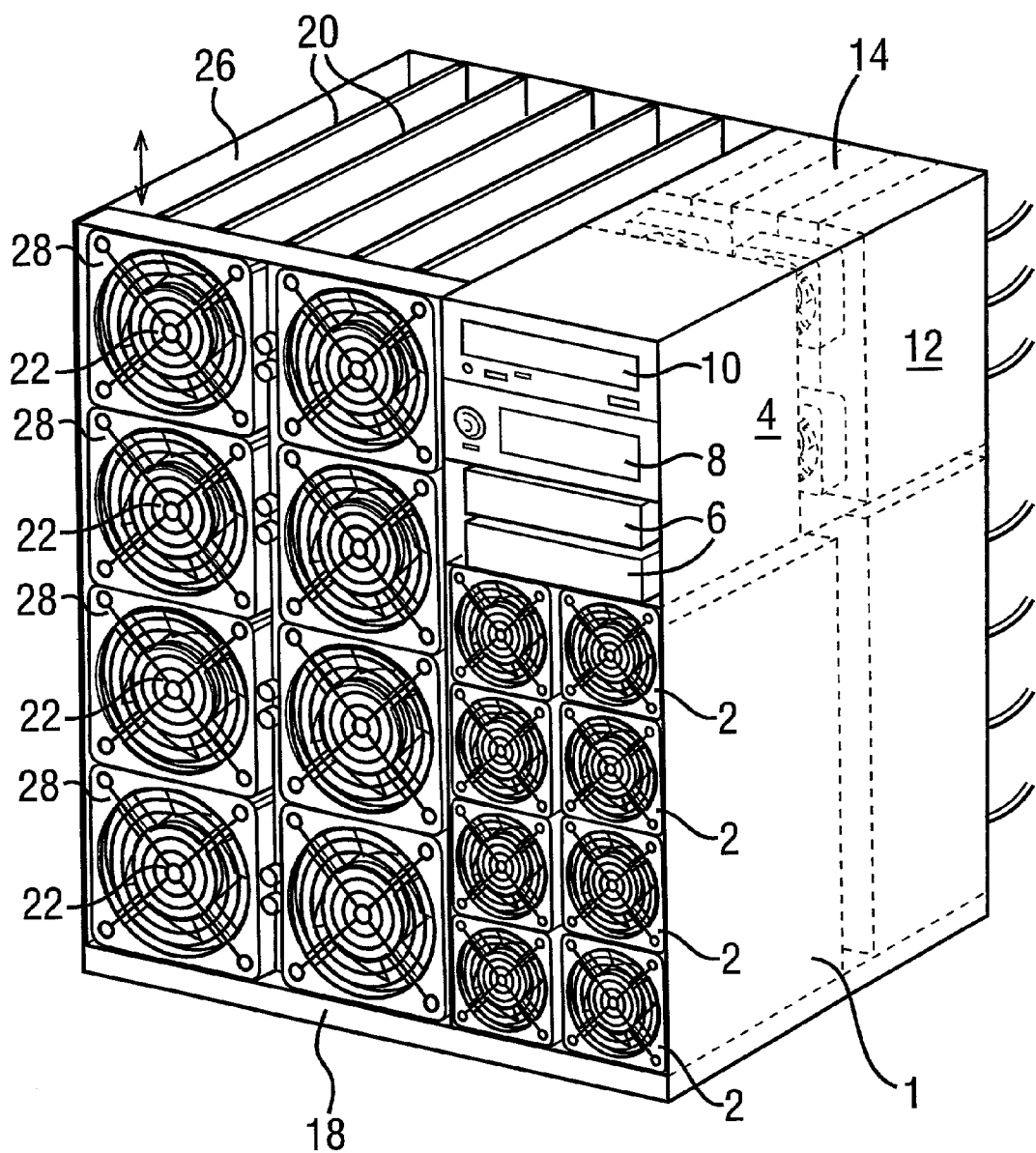
FIG. 1 is a schematic perspective view of an assembly according to an embodiment of the present invention.

Referring now to the drawings, in which like reference numerals are used to designate corresponding elements, FIG. 1 shows an assembly according to one embodiment of the invention that forms part of a server that may be employed for a number of services, for example as part of a local area network (LAN) or for other telecommunications purposes, and is designed to fit into, for example, a nineteen inch rack electronics cabinet. Other sizes may alternatively be employed, for example to fit into twenty three inch or metric racks. The assembly may be designed to be a so-called "RAS" system, that is to say, to have high reliability, availability and serviceability. As such, it is intended that the system will operate with the minimum amount of down time, and so a degree of redundancy is incorporated so that the system will continue to operate even when certain components have failed. In addition, servicing of the equipment should take as short a time as possible, and, where practical, components can be replaced without switching the system off.

The assembly comprises a chassis 1 in which the various components are located. The chassis contains a number of power modules 2 for converting mains a.c. power or d.c. power from a supply to an appropriate d.c. voltage, a media area 4 that contains hard disc drives 6, a tape drive 8 and a CD-ROM or digital video disc or digital versatile disc (DVD) drive 10, and a part 12 that contains a number of input/output (I/O) cards 14. A motherboard is located within the chassis in a horizontal plane at the bottom of the chassis in a tray-shaped holder 18, and a number of daughterboards 20 are arranged next to each other in a vertical plane above the motherboard and to the side of the power modules 2. The daughterboards may serve any of a number of purposes, for example having CPUs or may be repeater boards etc.

Eight fans 22 are provided in an array at the front of the chassis in order to blow air through the assembly between the daughterboards 20 for cooling the motherboard and the daughterboards. Each fan is driven by a brushless d.c. or a.c. motor 24 that is mounted in a block 26 to form a fan module 28.

Figure 2:
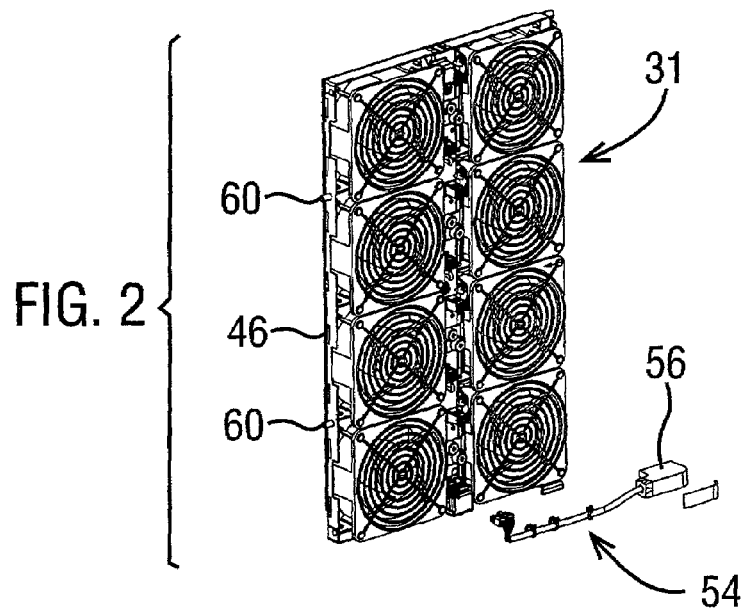
FIG. 2 is a perspective view of a panel that may be employed in an assembly shown in FIG. 1.
Figure 3:
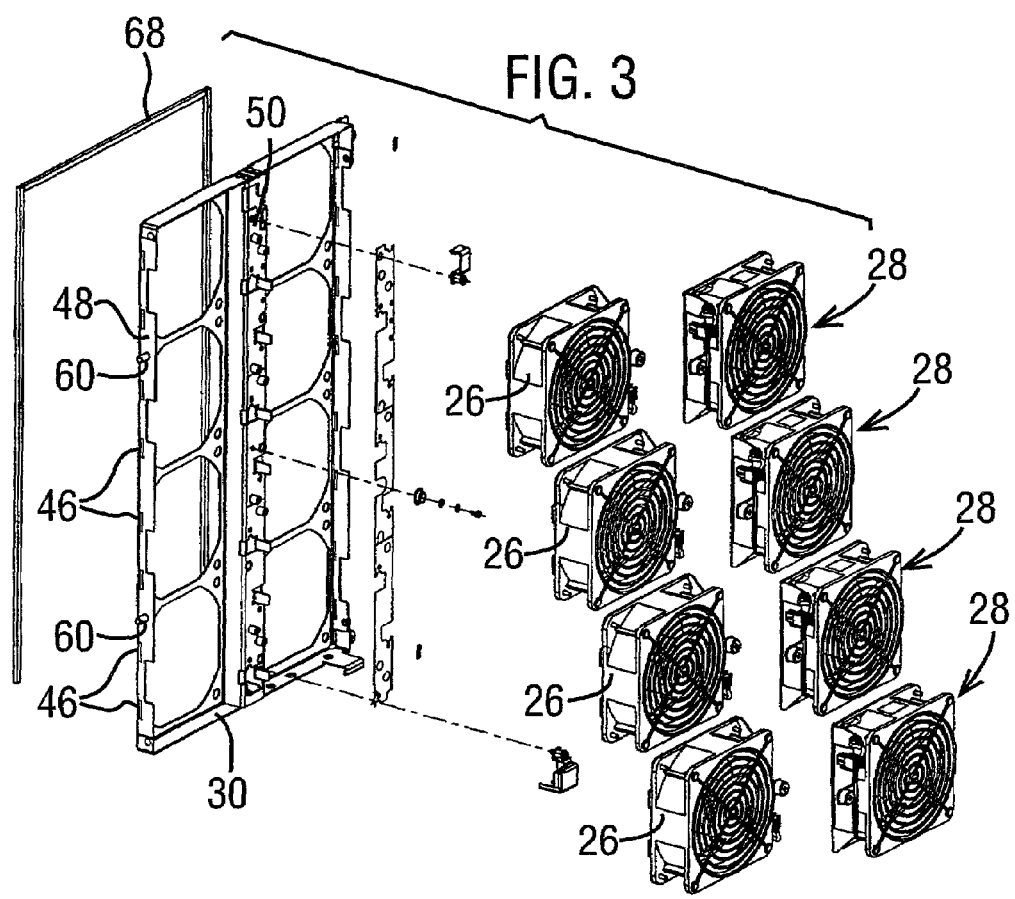
FIG. 3 is an exploded view of the panel of FIG. 2.
Figure 4:
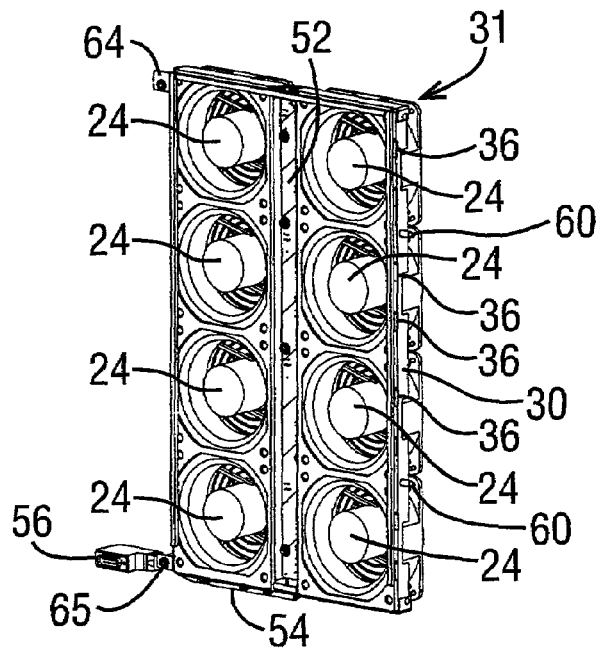
FIG. 4 is a view of the panel of FIGS. 2 and 3 taken from the other side.
Figure 5A:
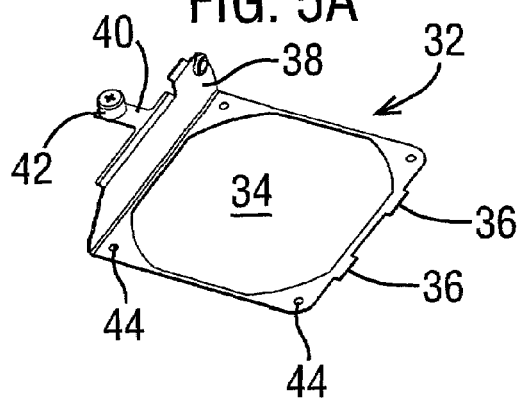
FIGS. 5a and 5b is a perspective views of an arrangement for securing a fan module in the panel of FIG. 2.
Figure 5B:
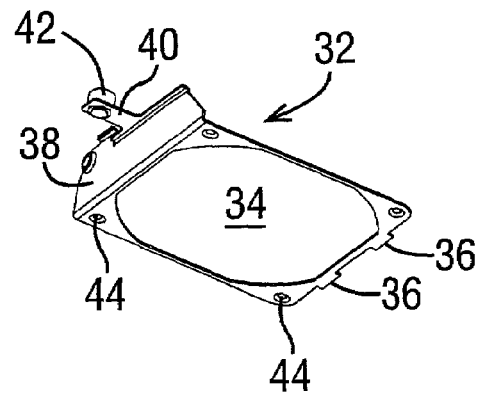
Figure 6:
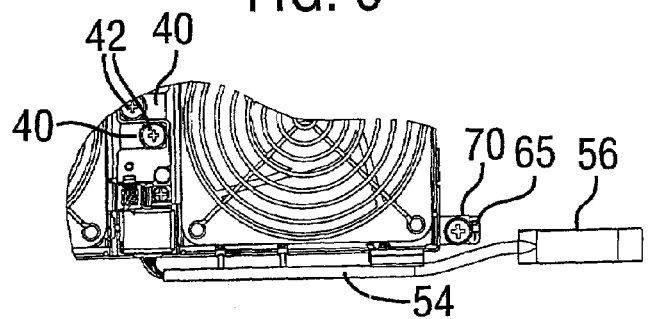
FIG. 6 is view of part of the panel of FIG. 2 on a larger scale.
Figure 7A:
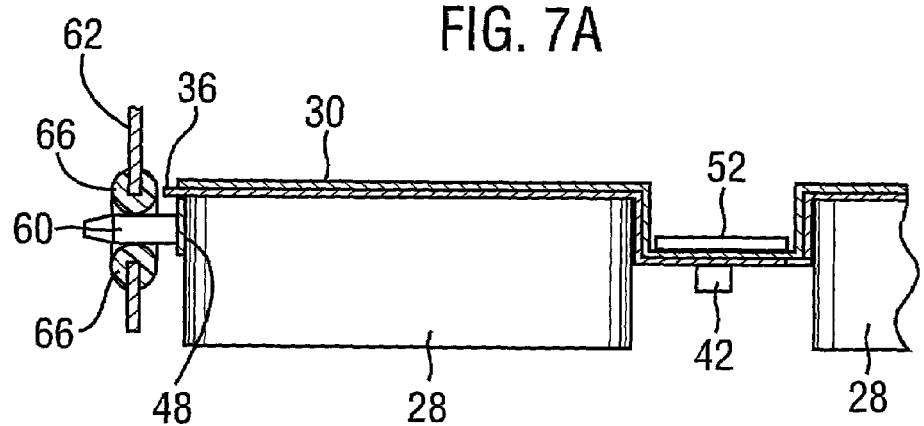
FIGS. 7a and 7b are views of part of the panel and chassis showing how the panel is attached.
Figure 7B:
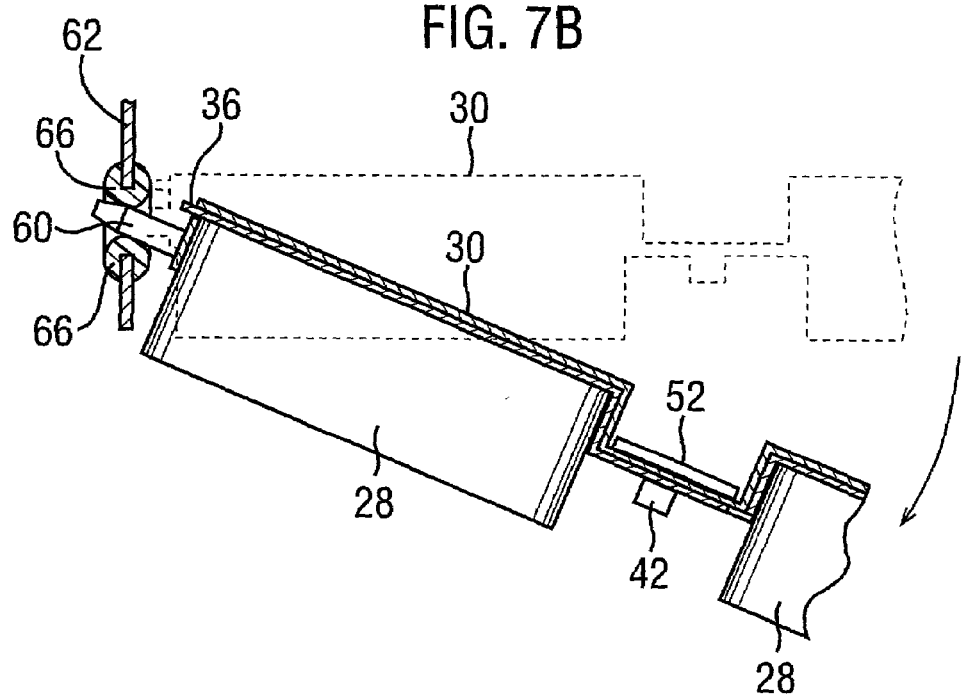

As shown in FIGS. 2 and 3, the modules 28 are housed in a holder 30 to form a panel 31, the holder being formed from a pressed 1.2 mm thick aluminium zinc plated steel sheet that is divided into eight compartments each having an aperture for allowing flow of air from the fan module. Other forms of holder may alternatively be employed for example plastics mouldings. Each fan module 28 includes a device 32 shown in FIG. 5 for retaining the module in the holder 30. The device may be formed from a material that is similar to or the same as that of the holder, for example 1.0 or 1.2 mm thick zinc plated or aluminium zinc plated steel. The device may generally be square in shape having a large central aperture 34, a pair of tabs 36 on one side and a flange 38 on the side opposite the tabs 36 from which a support 40 for a captive screw 42 is located. A hole 44 is located in each corner of the device for receiving a screw or other fastener to attach the device to the block 26 of the fan module.

The fan modules are inserted into the holder 30 so that the tabs 36 engage recesses 46 in the outer flange 48 of the holder and the captive screws 42 are aligned along a central line 50 of the holder. The central line 50 also includes electrical connectors to enable the fans 22 to be connected to a source of power once they are inserted in position.

A pcb 52 is located on the reverse side of the holder 30 running along the length thereof in the centre of the holder. The pcb 52 is provided with a monitoring arrangement for monitoring the fans and sending signals to the rest of the chassis 1 if any fan fails via signal and power cable 54 and connector 56.

The holder 30 is provided with two pins 60 in the outer flange 48 for supporting the holder on the main part of the chassis. When the panel is attached to the chassis, the pins are pushed through holes in a side wall 62 of the chassis to support the panel, and the panel is held against the main part of the chassis for example by means of a tab 64 or 65 at the top or bottom of the holder that holds a captive screw 70 of the same or similar type that secures the individual fans 22 to the holder. The holes into which the pins 60 are inserted also contain grommets 66 which can deform relatively easily to allow the panel 31 to be swung out from the main body of the chassis in the manner of a door. In addition, a compliant gasket 68 is provided that extends around the top and sides of the holder 30 in order to reduce bypass leakage of air around the panel.

The individual fan modules 28 can be mounted and secured to the holder in a quick and simple manner, simply by inserting the tabs 36 into the holes 46 in the flange of the holder, and tightening the captive screw 42 for each fan module. The module can then be connected to the source of power to energise it.

In operation, all eight fans 22 will serve to cool the motherboard and daughterboards 20. If one of the fans 22 fails, this will be registered by the monitoring arrangement, and the central service area will automatically be notified. In addition, the system may allow the remaining fans to speed up in order to minimise the reduction in capacity of the fan unit. The service engineer may, if it is decided to replace a single fan only, simply check which fan is at fault by looking at LEDs on the panel, and remove the fan by unscrewing the captive screw 42, disconnecting the module and taking the module out of the holder. A new fan module is then inserted, connected and secured by tightening screw 42.

The operation may be performed without removing the panel 31 itself from the chassis, and without the need to power the assembly down.

Alternatively, it may be necessary or desirable to replace all the fans 22. This may be necessary if, for example, there is a fault in the fan monitoring arrangement so that it is not possible to monitor the fans, but the fans are still operating. Alternatively, it may be decided that if any fan 22 has failed, all the fans may be nearing the end of their lifetime and so need to be replaced. In any case it may be desired to replace all the fans for preventative maintenance. In this case, after the assembly has been powered down, the screws 64 and 65 are loosened, the panel 31 is swung out on the hinges formed by the pins 60, disconnected and removed. A new panel is then inserted, secured and connected before the assembly is started again. The whole replacement operation may be performed in a matter of one or two minutes, and reduces the downtime of the system significantly.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. A chassis for an electronics assembly, the chassis comprising:
   (i) a frame; and
   (ii) a panel located on a face of the frame, the panel comprising a plurality of cooling fans and a holder for the fans,
   wherein the panel allows removal of individual fans from the panel and replacement of said individual fans while the panel is located on the frame, and the panel is attached to the frame by a mechanism that allows quick release and removal of the panel therefrom and replacement of the panel,
   wherein the panel is generally flat, and
   wherein at least one cooling fan in the plurality of cooling fans is secured to the holder by an arrangement that requires a tool to release it from the holder.

2. The chassis as claimed in claim 1, wherein each fan is attached to the holder by at least one cooperating tab and recess, and is secured to the holder by a threaded element.

3. The chassis as claimed in claim 2, wherein the tab is formed from a sheet member and the sheet member provides a support for the threaded element.

4. The chassis as claimed in claim 1, which contains a monitoring arrangement for monitoring each fan.

5. The chassis as claimed in claim 4, wherein the monitoring arrangement is located on the panel.

6. The chassis as claimed in claim 5, wherein the monitoring arrangement is located on a face of the panel directed to an interior of the chassis.

7. The chassis as claimed in claim 1, wherein the panel allows removal of individual fans from the holder while the remaining fans are in operation.

8. A chassis for an electronics assembly, the chassis comprising:
   (i) a frame; and
   (ii) a panel located on a face of the frame, the panel comprising a plurality of cooling fans and a holder for the fans,
   wherein the panel allows removal of individual fans from the panel and replacement of said individual fans while the panel is located on the frame, and the frame allowing removal of the panel therefrom and replacement of the panel, wherein the panel is attached thereto by means of a mechanism that allows quick release of the panel, wherein the panel is attached thereto by means of at least one pin that engages a corresponding recess, wherein the recess has a grommet to allow a degree of relative movement between the panel and the chassis.

9. The chassis as claimed in claim 8, wherein the panel is generally flat.

10. The chassis as claimed in claim 8, which includes a gasket that extends around all or some of a periphery of the panel between the panel and the chassis in order to prevent or reduce bypass leakage of air around the fans.

11. The chassis as claimed in claim 8, wherein the holder is formed from sheet metal.

12. The panel as claimed in claim 8, which includes a monitoring arrangement for monitoring each fan, the monitoring arrangement being located on an opposite side of the panel to that from which the fans can be removed.

13. A chassis for an electronics assembly, the chassis comprising:
   (i) a frame; and
   (ii) a panel located on a face of the frame, the panel comprising a plurality of cooling fans and a holder for the fans,
   wherein the panel allows removal of individual fans from the panel and replacement of said individual fans while the panel is located on the frame, and the frame allowing removal of the panel therefrom and replacement of the panel;
   wherein the holder is formed from sheet metal;
   wherein each fan includes a sheet member that provides an element for attachment of the fan to the holder, and the thickness of the panel is the sum of the thickness of the fan, the thickness of the sheet metal forming the holder and the thickness of the sheet member.

14. The chassis as claimed in claim 13, wherein the panel is secured to the chassis by an arrangement that requires a tool to release it from the chassis.

\* \* \* \* \*